(12) United States Patent
Kariya et al.

(10) Patent No.: US 9,935,029 B2
(45) Date of Patent: Apr. 3, 2018

(54) PRINTED WIRING BOARD FOR PACKAGE-ON-PACKAGE

(71) Applicant: IBIDEN CO., LTD., Ogaki-shi (JP)

(72) Inventors: Takashi Kariya, Ogaki (JP); Shigeru Yamada, Ogaki (JP); Masatoshi Kunieda, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 15/055,921

(22) Filed: Feb. 29, 2016

(65) Prior Publication Data

US 2016/0268188 A1  Sep. 15, 2016

(30) Foreign Application Priority Data

Mar. 12, 2015  (JP) .................................. 2015-049641

(51) Int. Cl.
*H01L 23/31* (2006.01)
*H01L 23/538* (2006.01)
*H01L 23/498* (2006.01)

(52) U.S. Cl.
CPC ...... *H01L 23/3121* (2013.01); *H01L 23/5389* (2013.01); *H01L 23/49811* (2013.01); *H01L 2224/16225* (2013.01); *H01L 2924/181* (2013.01)

(58) Field of Classification Search
CPC . H01L 23/31; H01L 23/3114; H01L 23/3121; H01L 23/3157; H01L 23/5389
See application file for complete search history.

(56) References Cited

U.S. PATENT DOCUMENTS

2006/0051895 A1* 3/2006 Abe ..................... H01L 23/5389
                                                                    438/108
2014/0091442 A1* 4/2014 Cheah ................. H01L 23/5389
                                                                    257/666
2015/0008021 A1* 1/2015 Ishida ................. H05K 3/4015
                                                                    174/257
2015/0076691 A1* 3/2015 Kim .................... H01L 23/5389
                                                                    257/738

FOREIGN PATENT DOCUMENTS

JP      2009-135398 A     6/2009

* cited by examiner

*Primary Examiner* — Cuong Q Nguyen
(74) *Attorney, Agent, or Firm* — Oblon, McClelland, Maier & Neustadt, L.L.P.

(57) ABSTRACT

A printed wiring board for package-on-package includes a first insulating layer, a wiring layer including a conductor pattern and formed on first surface of the first insulating layer, a second insulating layer formed on first surface side of the first insulating layer, electrodes formed in through holes of the first insulating layer respectively such that the electrodes electrically connect to the conductor pattern and have exposed surfaces exposed from second surface of the first insulating layer, first pads formed on the second insulating layer and positioned to connect an IC chip in center portion of the second insulating layer, second pads formed on the second insulating layer and positioned in outer edge portion of the second insulating layer to connect a second printed wiring board, and via conductors formed in the second insulating layer such that the via conductors electrically connect the first and second pads to the conductor pattern.

20 Claims, 16 Drawing Sheets

PRINTED WIRING BOARD FOR PACKAGE-ON-PACKAGE

CROSS-REFERENCE TO RELATED APPLICATIONS

The present application is based upon and claims the benefit of priority to Japanese Patent Application No. 2015-049641, filed Mar. 12, 2015, the entire contents of which are incorporated herein by reference.

BACKGROUND OF THE INVENTION

Field of the Invention

The present invention relates to a printed wiring board for package-on-package (POP).

Description of Background Art

Japanese Patent Laid-Open Publication No. 2009-135398 describes a printed wiring board for package-on-package. The printed wiring board for package-on-package in Japanese Patent Laid-Open Publication No. 2009-135398 includes a lower substrate to which a printed wiring board is attached, an upper substrate to which a package substrate is mounted, and an interposer that is interposed between the lower substrate and the upper substrate and has a metal post. The lower substrate has a pad that is formed on a surface on one side of the lower substrate for connecting to the upper substrate, and a pad that is formed on a surface on the other side of the lower substrate for connecting to a printed wiring board. The upper substrate has a pad that is formed on a surface on one side of the upper substrate for connecting to the lower substrate, and a pad that is formed on a surface on the other side of the upper substrate for connecting to a package substrate. The pad for connecting to the lower substrate and the pad for connecting to the upper substrate are electrically connected by the metal post. Further, an IC chip is mounted between the lower substrate and the upper substrate. The entire contents of this publication are incorporated herein by reference.

SUMMARY OF THE INVENTION

According to one aspect of the present invention, a printed wiring board for package-on-package includes a first insulating layer having through holes, a wiring layer including a conductor pattern and formed on a first surface of the first insulating layer, a second insulating layer laminated on the first insulating layer such that the second insulating layer is formed on a first surface side of the first insulating layer, electrodes formed in the through holes of the first insulating layer respectively such that the electrodes electrically connect to the conductor pattern and have exposed surfaces exposed from a second surface of the first insulating layer on the opposite side with respect to the first surface, first pads formed on the second insulating layer such that the first pads are positioned to connect an IC chip in a center portion of a surface of the second insulating layer, second pads formed on the second insulating layer such that the second pads are positioned in an outer edge portion of the surface of the second insulating layer to connect a second printed wiring board, and via conductors formed in the second insulating layer such that the via conductors electrically connect the first pads and the second pads to the conductor pattern of the wiring layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
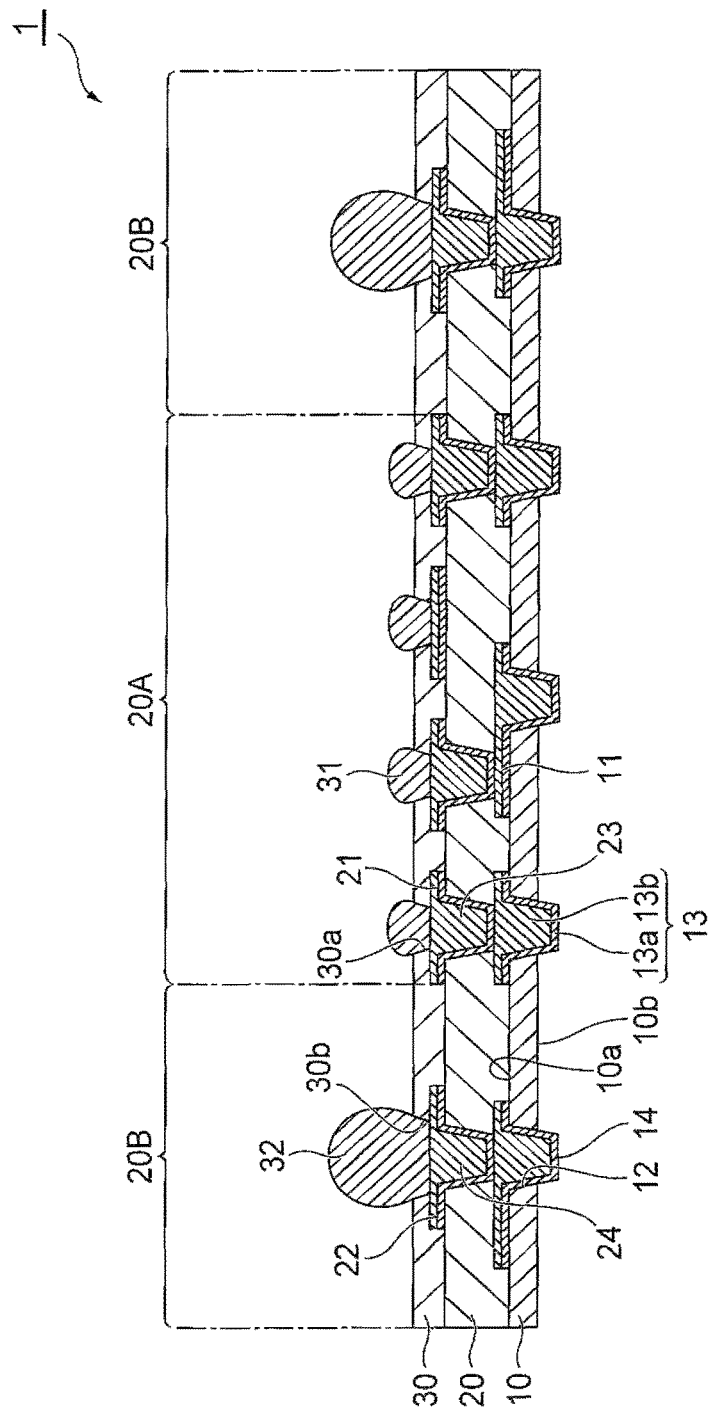
FIG. 1 is a cross-sectional view illustrating a printed wiring board for package-on-package according to a first embodiment.

The embodiments will now be described with reference to the accompanying drawings, wherein like reference numerals designate corresponding or identical elements throughout the various drawings.

First Embodiment

As illustrated in FIG. 1, a printed wiring board 1 for package-on-package according to the present embodiment includes a first insulating layer 10 that has a first surface (10a) and a second surface (10b) that is on an opposite side of the first surface (10a), a conductor pattern 11 that is formed on the first surface (10a) of the first insulating layer 10, and a second insulating layer 20 that is laminated on the first surface (10a) side of the first insulating layer 10. A conductor pattern in the present embodiment is a wiring layer that forms an electrical circuit, and may include a pad and a wiring pattern or the like or may include only a conductor pad, depending on a formation position of the conductor pattern.

The first insulating layer 10 is formed as a lower portion of the printed wiring board 1 for package-on-package. The first insulating layer 10 is formed of a thermosetting resin, a photosensitive resin, a resin that is obtained by adding a photosensitive group to a portion of a thermosetting resin, a thermoplastic resin, a resin composite that contains these resins, or the like. The first insulating layer 10 has through holes 12 that are provided inside the first insulating layer 10. Electrodes 13 are formed inside the through holes 12.

The electrodes 13 each have a truncated cone shape that decreases in diameter in a direction from the first surface (10a) toward the second surface (10b). As illustrated in FIG. 1, one end of each of the electrodes 13 is electrically connected to the conductor pattern 11 that is formed on the first surface (10a) of the first insulating layer 10, and the other end of each of the electrodes 13 is exposed to outside from the second surface (10b) of the first insulating layer 10. A surface 14 of each of the electrodes 13 that is exposed to the outside protrudes to the outside from the second surface (10b) of the first insulating layer 10.

The electrodes 13 are each formed, for example, from an electroless plating layer and an electrolytic plating layer. In the present embodiment, the electrodes 13 are each formed from an electroless copper plating layer (13a) and an electrolytic copper plating layer (13b). The electrolytic copper plating layer (13b) is formed inside the electrodes 13. The electroless copper plating layer (13a) is formed around the electrolytic copper plating 10 layer (13b) so as to surround the electrolytic copper plating layer (13b). The conductor pattern 11 is formed, for example, from an electroless plating layer and an electrolytic plating layer. The second insulating layer 20 is laminated on the first surface (10a) of the first insulating layer 10 and on the conductor pattern 11, and is formed of the same material as the first insulating layer 10.

Figure 2:
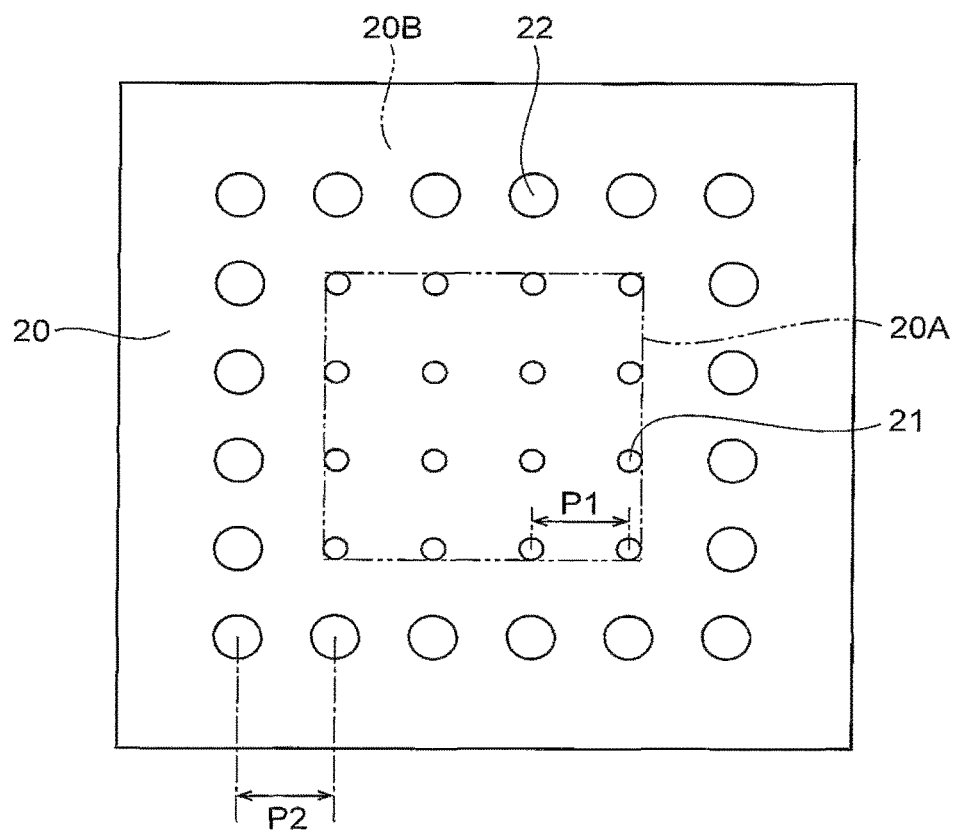
FIG. 2 is a plan view illustrating array positions of first pads and second pads.

On the second insulating layer 20, first pads 21 for connecting to an IC chip and second pads 22 for connecting to another printed wiring board are respectively formed. As illustrated in FIG. 2, the first pads 21 are arrayed in a center portion (20A) of the second insulating layer 20, and the second pads 22 are arrayed in an outer edge portion (20B) of the second insulating layer 20. The first pads 21 are arrayed at a predetermined array pitch (P1) in the center portion (20A). On the other hand, the second pads 22 are arrayed in the outer edge portion (20B) of the second insulating layer 20 so as to surround the first pads 21 from the surroundings. An array pitch (P2) of the second pads 22 is larger than the array pitch (P1) of the first pads 21. Here, a "pitch" means a distance between centers of adjacent pads.

The first pads 21 and the second pads 22 are each formed, for example, from an electroless plating layer and an electrolytic plating layer. Further, in a plan view, an area of each of the second pads 22 is larger than an area of each of the first pads 21.

Via conductors 23 for electrically connecting the first pads 21 and the conductor pattern 11 and via conductors 24 for electrically connect the second pads 22 and the conductor pattern 11 are respectively formed inside the second insulating layer 20. The via conductors 23 and the via conductors 24 each have a truncated cone shape that decreases in diameter in a direction from the first surface (10a) of the first insulating layer 10 toward the second surface (10b) of the first insulating layer 10. Similar to the above-described electrodes 13, the via conductors 23 and the via conductors 24 are each formed from an electroless plating layer and an electrolytic plating layer.

A solder resist layer 30 is laminated on the second insulating layer 20. The solder resist layer 30 has first openings (30a) that each expose a portion of one of the first pads 21 to the outside and second openings (30b) that each expose a portion of one of the second pads 22 to the outside. In this way, an effect is achieved that a surface of the second insulating layer 20 can be protected, and at the same time, solder can be prevented from being attached to a portion where solder is not required during mounting, and thus, mounting reliability can be improved. It is not necessarily required to form the solder resist layer 30. In place of the solder resist layer 30, it is also possible that only a treatment film, such as an electroless Ni/Pd/Au film, an electroless Ni/Au film, or an OSP (Organic Solderability Preservative) film, is formed on the surface of the second insulating layer 20.

As illustrated in FIG. 1, solder bumps 31 are respectively formed on the first pads 21. The solder bumps 31 are respectively provided in spaces that are respectively formed by the first pads 21 and the first openings (30a) of the solder resist layer 30, and are respectively in close contact with the first pads 21. Here, in order to increase adhesion between the first pads 21 and the solder bumps 31, it is preferable that surfaces of the first pads 21 be subjected to a roughening treatment before the formation of the solder bumps 31. As a method of the roughening treatment, for example, an etching method can be used. The solder bumps 31 correspond to "second connection terminals" in the claims, and are structures for electrically connecting the first pads 21 and terminals of an IC chip when the IC chip is mounted.

Solder bumps 32 are respectively formed on the second pads 22. The solder bumps 32 are respectively provided in spaces that are respectively formed by the second pads 22 and the second openings (30b) of the solder resist layer 30, and are respectively in close contact with the second pads 22. Here, in order to increase adhesion between the second pads 22 and the solder bumps 32, it is preferable that surfaces of the second pads 22 be subjected to a roughening treatment before the formation of the solder bumps 32. The solder bumps 32 correspond to "first connection terminals" in the claims, and are structures for electrically connecting the second pads 22 and terminals or the like of another printed wiring board when the other printed wiring board is mounted.

In the printed wiring board 1 for package-on-package having the above-described structure, the electrodes 13 are formed in the through holes 12 of the first insulating layer 10 and are exposed to the outside from the second surface (10b) of the first insulating layer 10. Therefore, using the electrodes 13 as mounting pads, the printed wiring board 1 for package-on-package can be directly mounted on an external substrate or the like. Therefore, it is no longer necessary to provide mounting pads that are formed of a conductor pattern, and reduction in thickness of the printed wiring board 1 for package-on-package can be achieved. Further, the first pads 21 are arrayed in the center portion (20A) of the second insulating layer 20 for connecting to an IC chip, and the second pads 22 are arrayed in the outer edge portion (20B) of the second insulating layer 20 for connecting to another printed wiring board. In this way, by providing the first pads 21 and the second pads 22 in the second insulating layer 20, a height of the printed wiring board 1 for package-on-package is suppressed and reduction in thickness can be easily achieved.

Further, it is no longer necessary to provide mounting pads that are formed of a conductor pattern, and an interface is not formed between a pad and a via conductor. Therefore, occurrence of fine peeling or a shape defect at an interface can be prevented and mounting reliability can be improved. Further, the surface 14 of each of the electrodes 13 that is exposed to the outside protrudes to the outside from the second surface (10b) of the first insulating layer 10. Therefore, a stress relaxation effect can be achieved during mounting, and the mounting reliability can be further improved.

Second Embodiment

Figure 3:
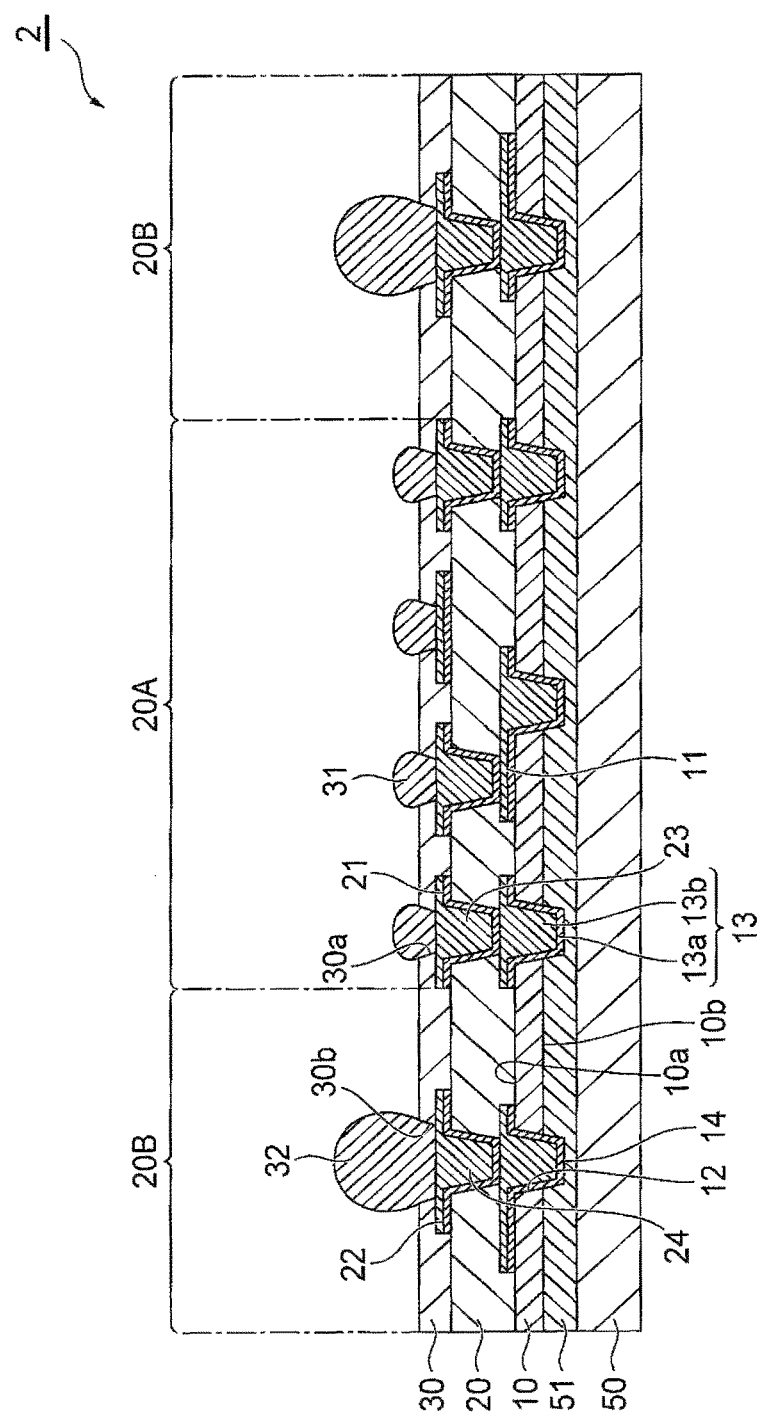
FIG. 3 is a cross-sectional view illustrating a printed wiring board for package-on-package according to a second embodiment.

In the following, with reference to FIG. 3, a second embodiment of the present invention is described. A printed wiring board 2 for package-on-package according to the present embodiment is different from the first embodiment in that a support plate 50 is pasted on the second surface (10b) side of the first insulating layer 10. The other structures and the like are the same as the first embodiment.

Specifically, the support plate 50 is pasted on the second surface (10b) side of the first insulating layer 10 via a release layer 51. The support plate 50 is formed, for example, from a glass or a prepreg material with a copper foil. In the present embodiment, considering a case of removing the support plate 50 later, a glass that transmits laser is used for the support plate 50. On the other hand, the release layer 51 is formed, for example, from a thermoplastic polyimide resin. In the present embodiment, each the through holes 12 penetrates the first insulating layer 10 and further reaches to a middle position in the release layer 51. Therefore, a front end portion of each of the electrodes 13 that are formed in the through holes 12 enters into the release layer 51, and the surface 14 of each of the electrodes 13 is positioned inside the release layer 51.

In the printed wiring board 2 for package-on-package according to the present embodiment, in addition to that the same effect as the first embodiment can be obtained, since the support plate 50 is pasted on the second surface (10b) side of the first insulating layer 10, strength of the printed wiring board 2 for package-on-package can be increased, and occurrence of warpage can be prevented.

Third Embodiment

Figure 4:
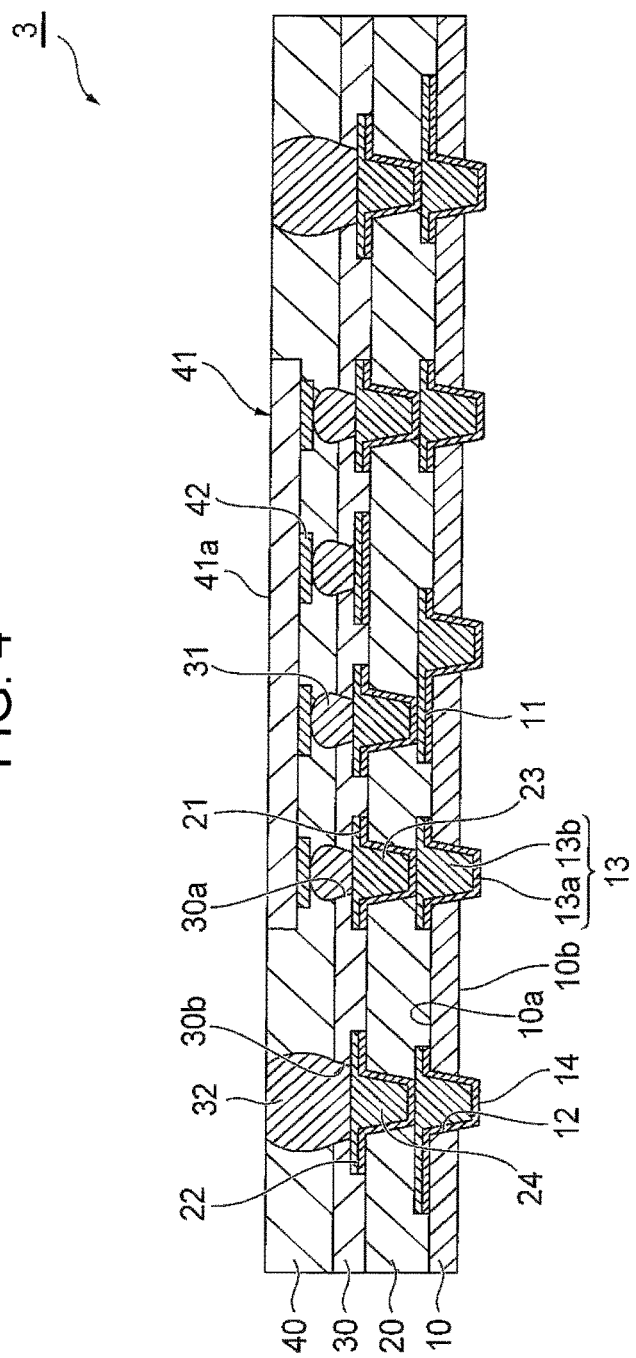
FIG. 4 is a cross-sectional view illustrating a printed wiring board for package-on-package according to a third embodiment.

In the following, with reference to FIG. 4, a third embodiment of the present invention is described. A printed wiring board 3 for package-on-package according to the present embodiment is different from the first embodiment in that an IC chip 41 is mounted on the printed wiring board 1 for package-on-package according to the first embodiment and is further sealed by a sealing resin layer 40. The other structures and the like are the same as the first embodiment.

Specifically, the IC chip 41 is mounted on the second insulating layer 20 side. The IC chip 41 is mounted on the first pads 21 via the solder bumps 31. Terminals 42 of the IC chip 41 are electrically connected to the first pads 21 by the solder bumps 31. The IC chip 41, the solder bumps 31 and the solder bumps 32 are further sealed by the sealing resin layer 40. The sealing resin layer 40 is laminated on the solder resist layer 30 on the second insulating layer 20 side. Although the solder bumps 32 are sealed by the sealing resin layer 40, at least a portion of a front end of each of the solder bumps 32 is exposed to the outside from the sealing resin layer 40. Further, a surface (41a) of the IC chip 41 is exposed to the outside from the sealing resin layer 40.

In the printed wiring board 3 for package-on-package according to the present embodiment, in addition to the same operation effect as the first embodiment, the following operation effect can be further obtained. That is, since at least a portion of the front end of each of the solder bumps 32 is exposed to the outside from the sealing resin layer 40, another printed wiring board can be positioned above the IC chip 41 and can be mounted on the second pads 22 via the solder bumps 32. As a result, a space above the IC chip 41 can be effectively utilized, and reduction in thickness of an entire POP structure in which the printed wiring board 3 for package-on-package is used can be easily achieved.

Further, since the surface (41a) of the IC chip 41 is exposed to the outside from the sealing resin layer 40, heat generated during operation of the IC chip 41 can be quickly released to the outside via the surface (41a), and an effect is achieved that heat dissipation performance of the printed wiring board 3 for package-on-package is enhanced. Further, since there is no sealing resin layer 40 covering the surface (41a) of the IC chip 41 from above, reduction in thickness of the printed wiring board 3 for package-on-package can be even more easily achieved.

Figure 5:
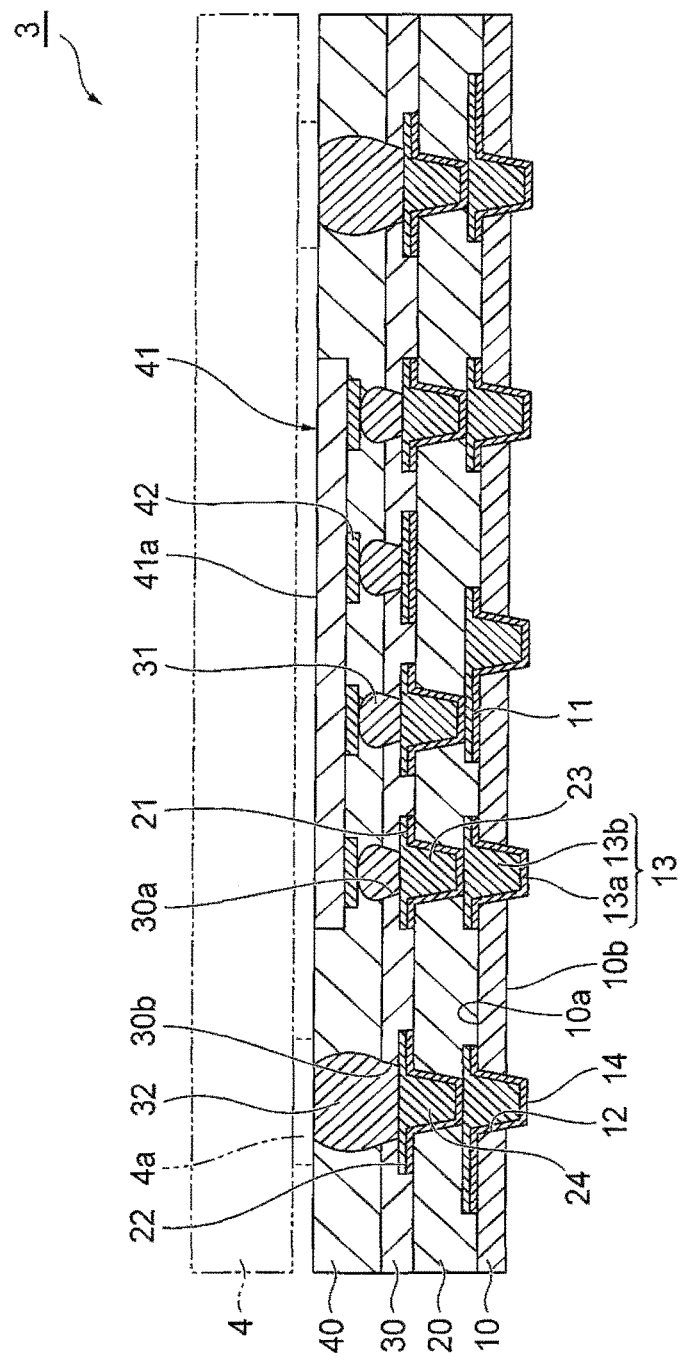
FIG. 5 is an explanatory diagram of a POP structure in which a printed wiring board for package-on-package is used.

FIG. 5 illustrates an example of a POP structure in which the printed wiring board 3 for package-on-package is used. Another printed wiring board 4 is positioned on the sealing resin layer 40 side. The another printed wiring board 4 is installed above the IC chip 41, and is mounted on the second pads 22 of the printed wiring board 3 for package-on-package via the solder bumps 32. Mounting pads (4a) of the another printed wiring board 4 are electrically connected to the second pads 22 via the solder bumps 32.

Fourth Embodiment

Figure 6:
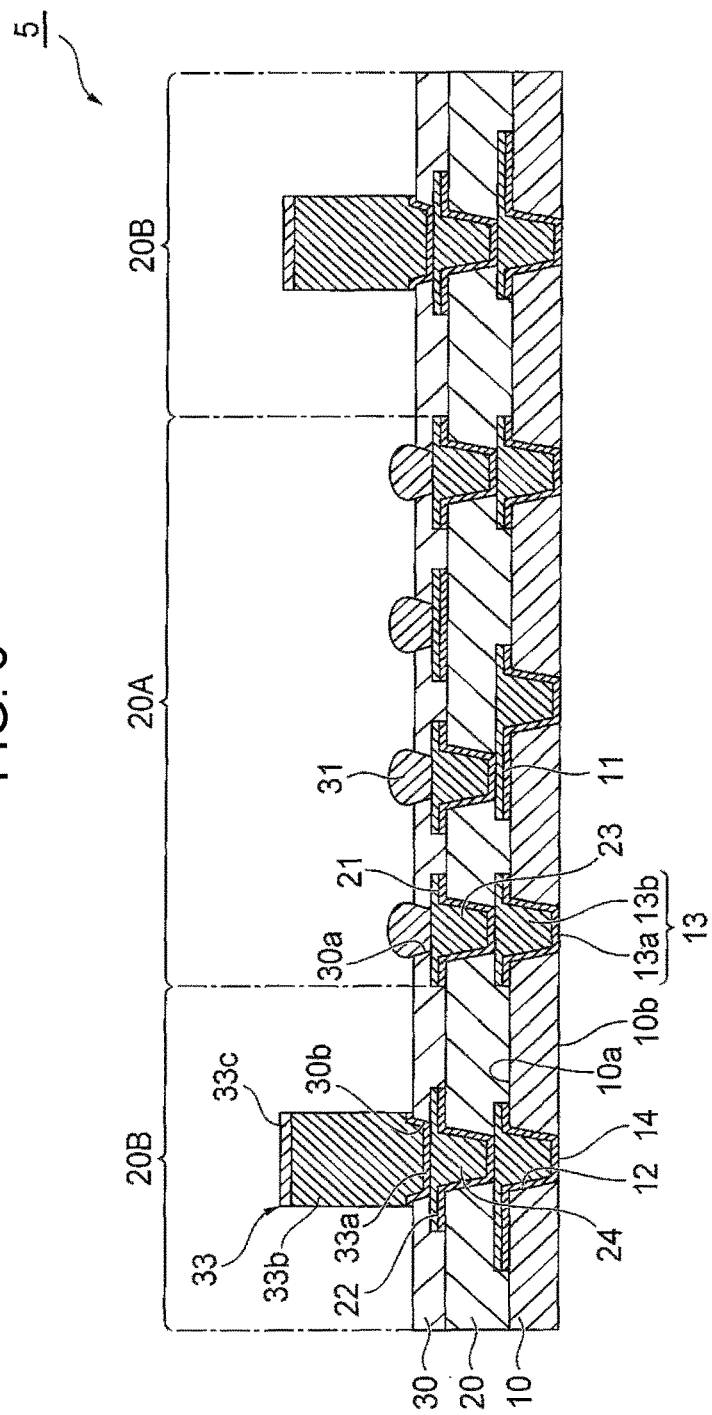
FIG. 6 is a cross-sectional view illustrating a printed wiring board for package-on-package according to a fourth embodiment.

In the following, with reference to FIG. 6, a fourth embodiment of the present invention is described. A printed wiring board 5 for package-on-package according to the present embodiment is different from the first embodiment in that the surface 14 of each of the electrodes 13 is positioned on the same plane as the second surface (10b) of the first insulating layer 10 and conductor posts 33 are provided in place of the solder bumps 32. The other structures and the like are the same as the first embodiment.

Specifically, one end of each of the electrodes 13 is electrically connected to the conductor pattern 11 that is formed on the first surface (10a) of the first insulating layer 10, and the other end of each of the electrodes 13 is exposed to the outside from the second surface (10b) of the first insulating layer 10. The surface 14 of each of the electrodes 13 that is exposed to the outside is positioned on the same plane as the second surface (10b) of the first insulating layer 10.

The conductor posts 33 that each have a columnar shape are respectively formed on the second pads 22. The conductor posts 33 are respectively erected on the second pads 22 and protrude to the outside from the second openings (30b) of the solder resist layer 30. The conductor posts 33 are each formed, for example, from a seed layer (33a), an electrolytic plating layer (33b) and a solder plating layer (33c).

The seed layer (33a) is formed on a side closest to the second pad 22 and forms a bottom portion of the conductor post 33. The solder plating layer (33c) is formed on a side farthest from the second pad 22 and forms a top portion of the conductor post 33. The electrolytic plating layer (33b) is formed between the seed layer (33a) and the solder plating layer (33c). The conductor posts 33 correspond to the "first connection terminals" in the claims, and are structures for electrically connecting the second pads 22 and terminals or the like of another printed wiring board when the another printed wiring board is mounted.

In the printed wiring board 5 for package-on-package according to the present embodiment, in addition to that the same operation effect as the first embodiment can be obtained, since the surface 14 of each of the electrodes 13 that is exposed to the outside is positioned on the same plane as the second surface (10b) of the first insulating layer 10, flatness of the second surface (10b) can be maintained, mountability can be improved when another printed wiring board such as a motherboard or the like is mounted via the second surface (10b), and occurrence of solder bridging during mounting can be prevented by using a self-alignment effect.

Fifth Embodiment

In the following, with reference to FIG. 7, a fifth embodiment of the present invention is described. A printed wiring board 6 for package-on-package according to the present embodiment is different from the fourth embodiment in that a support plate 50 is pasted on the second surface (10b) side of the first insulating layer 10. The other structures and the like are the same as the fourth embodiment.

Figure 7:
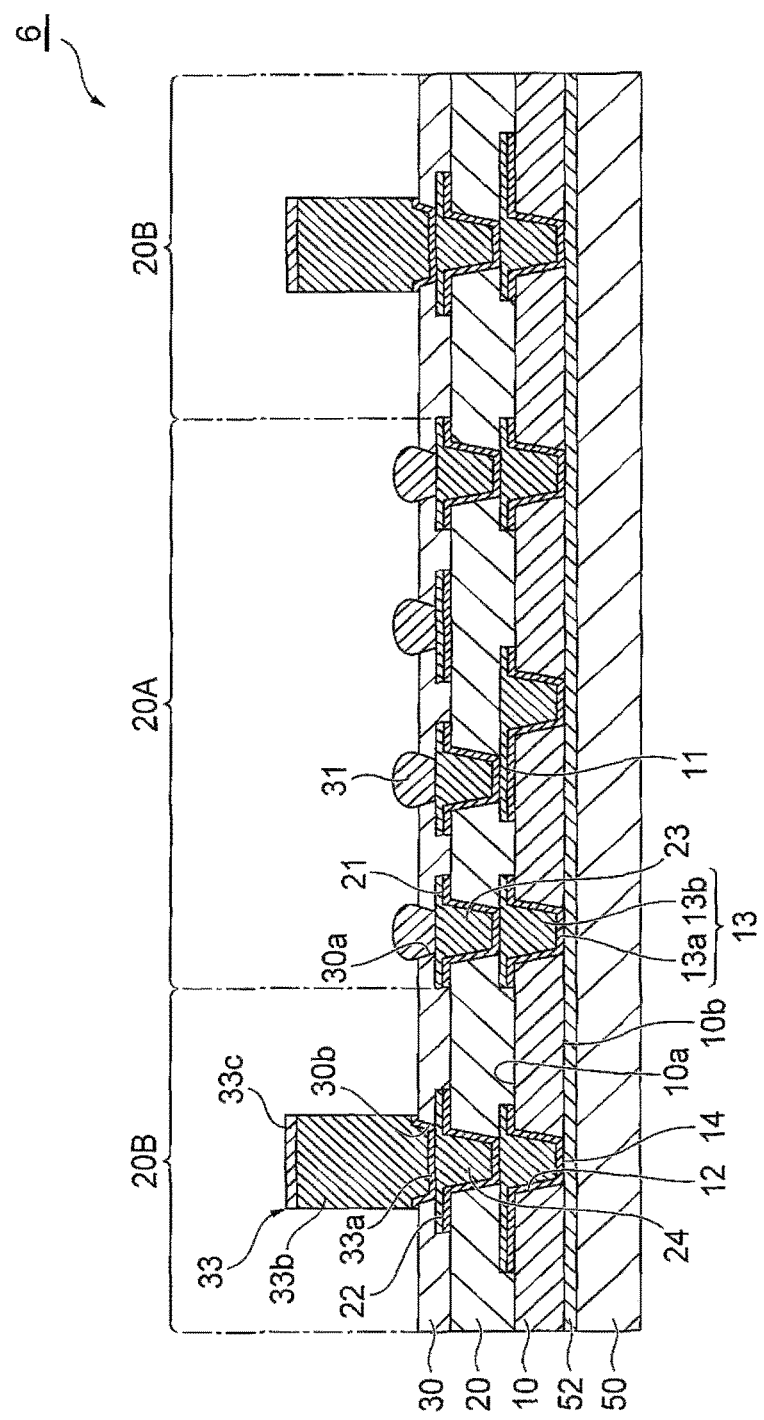
FIG. 7 is a cross-sectional view illustrating a printed wiring board for package-on-package according to a fifth embodiment.

As illustrated in FIG. 7, the support plate 50 is pasted on the second surface (10b) side of the first insulating layer 10 via a release layer 52. A glass that transmits laser is used for the support plate 50, and a thermoplastic polyimide resin is used for the release layer 52. In the so formed printed wiring board 6 for package-on-package, in addition to that the same effect as the fourth embodiment can be obtained, since the support plate 50 is pasted on the second surface (10b) side of the first insulating layer 10, strength of the printed wiring board 6 for package-on-package can be increased, and occurrence of warpage can be prevented.

Sixth Embodiment

Figure 8:
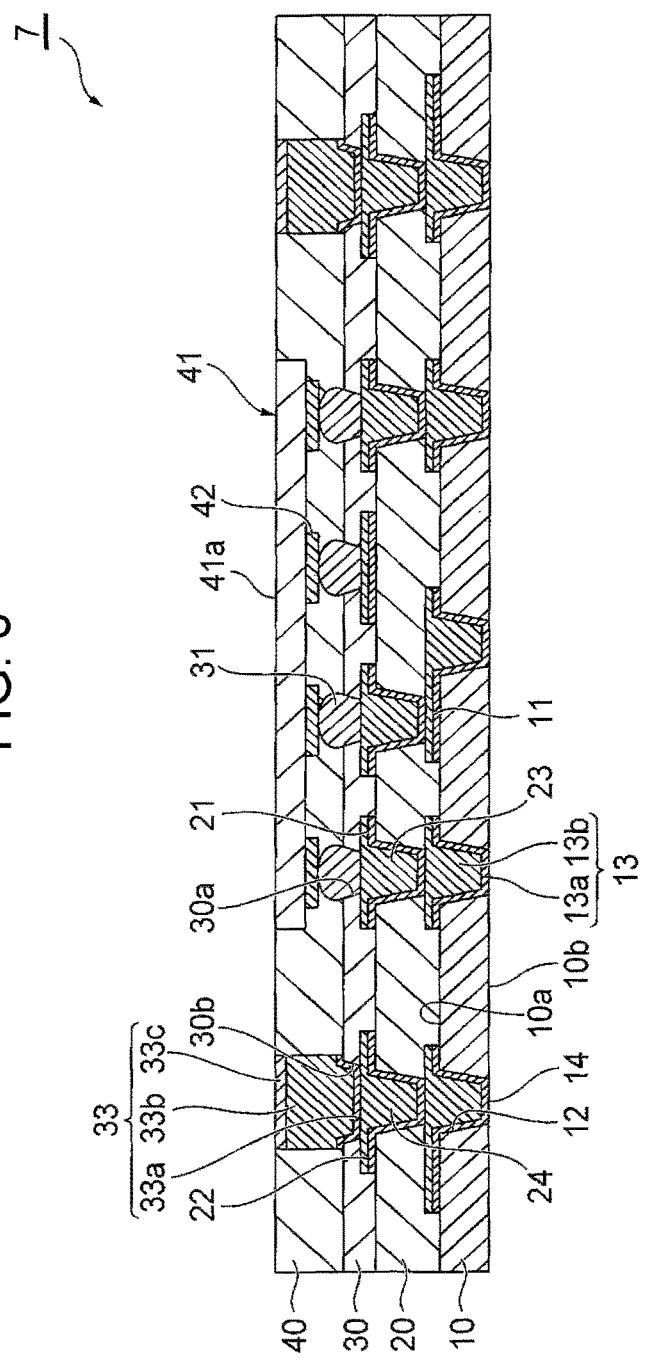
FIG. 8 is a cross-sectional view illustrating a printed wiring board for package-on-package according to a sixth embodiment.

In the following, with reference to FIG. 8, a sixth embodiment of the present invention is described. A printed wiring board 7 for package-on-package according to the present embodiment is different from the fourth embodiment in that an IC chip 41 is mounted on the printed wiring board 5 for package-on-package according to the fourth embodiment and is further sealed by a sealing resin layer 40. The other structures and the like are the same as the fourth embodiment.

Specifically, the IC chip 41 is mounted on the second insulating layer 20 side. The IC chip 41 is mounted on the first pads 21 via the solder bumps 31. Terminals 42 of the IC chip 41 are electrically connected to the first pads 21 by the solder bumps 31. The IC chip 41, the solder bumps 31 and the conductor posts 33 are further sealed by the sealing resin layer 40. The sealing resin layer 40 is laminated on the solder resist layer 30 on the second insulating layer 20 side. Although the conductor posts 33 are sealed by the sealing resin layer 40, at least a portion of a front end of each of the conductor posts 33 (that is, a portion of the solder plating layer (33c) of each of the conductor posts 33) is exposed to the outside from the sealing resin layer 40. Further, a surface (41a) of the IC chip 41 is exposed to the outside from the sealing resin layer 40.

In the printed wiring board 7 for package-on-package according to the present embodiment, in addition to the same operation effect as the fourth embodiment, the following operation effect can be further obtained. That is, since at least a portion of the front end of each of the conductor posts 33 is exposed to the outside from the sealing resin layer 40, another printed wiring board can be positioned above the IC chip 41 and can be mounted on the second pads 22 via the conductor posts 33. As a result, a space above the IC chip 41 can be effectively utilized, and reduction in thickness of an entire POP structure in which the printed wiring board 7 for package-on-package is used can be easily achieved.

Further, since the surface (41a) of the IC chip 41 is exposed to the outside from the sealing resin layer 40, heat generated during operation of the IC chip 41 can be quickly released to the outside via the surface (41a), and an effect is achieved that heat dissipation performance of the printed wiring board 7 for package-on-package is enhanced. Further, since there is no sealing resin layer 40 covering the surface (41a) of the IC chip 41 from above, reduction in thickness of the printed wiring board 7 for package-on-package can be even more easily achieved.

Seventh Embodiment

Figure 9:
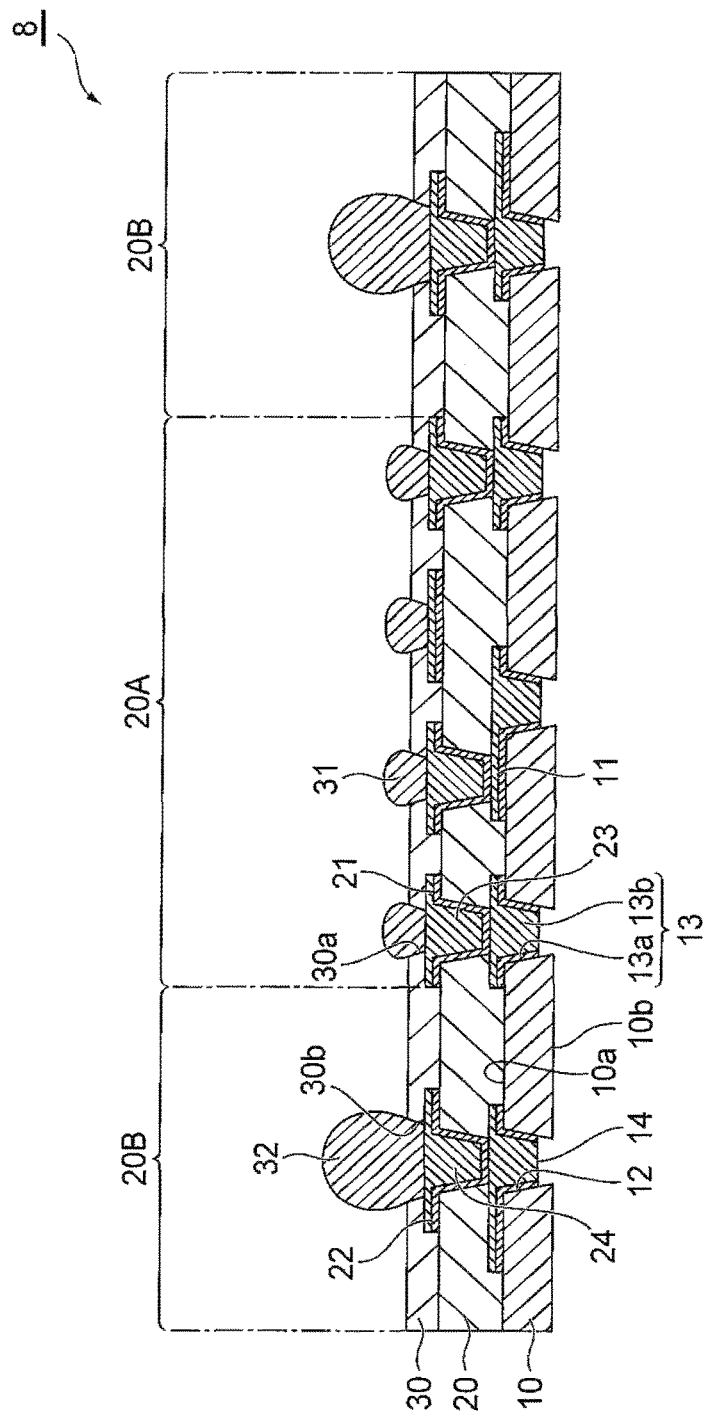
FIG. 9 is a cross-sectional view illustrating a printed wiring board for package-on-package according to a seventh embodiment.

In the following, with reference to FIG. 9, a seventh embodiment of the present invention is described. A printed wiring board 8 for package-on-package according to the present embodiment is different from the first embodiment in that the surface 14 of each of the electrodes 13 is recessed into the inside relative to the second surface (10b) of the first insulating layer 10. The other structures and the like are the same as the first embodiment.

Specifically, the surface 14 of each of the electrodes 13 that is exposed to the outside is recessed into the inside of the printed wiring board 8 for package-on-package (that is, toward the first surface (10a) side of the first insulating layer 10) as compared to the second surface (10b) of the first insulating layer 10. Preferably, the surface 14 is recessed about 3-15 μm into the inside relative to the second surface (10b) of the first insulating layer 10. In the printed wiring board 8 for package-on-package according to the present embodiment, in addition to that the same operation effect as the first embodiment can be obtained, since the surface 14 of each of the electrodes 13 is recessed into the inside relative to the second surface (10b) of the first insulating layer 10, during mounting, that a solder bump flows into an adjacent electrode 13 can be surely prevented, and further improvement in mountability and in mounting reliability can be achieved.

Eighth Embodiment

Figure 10:
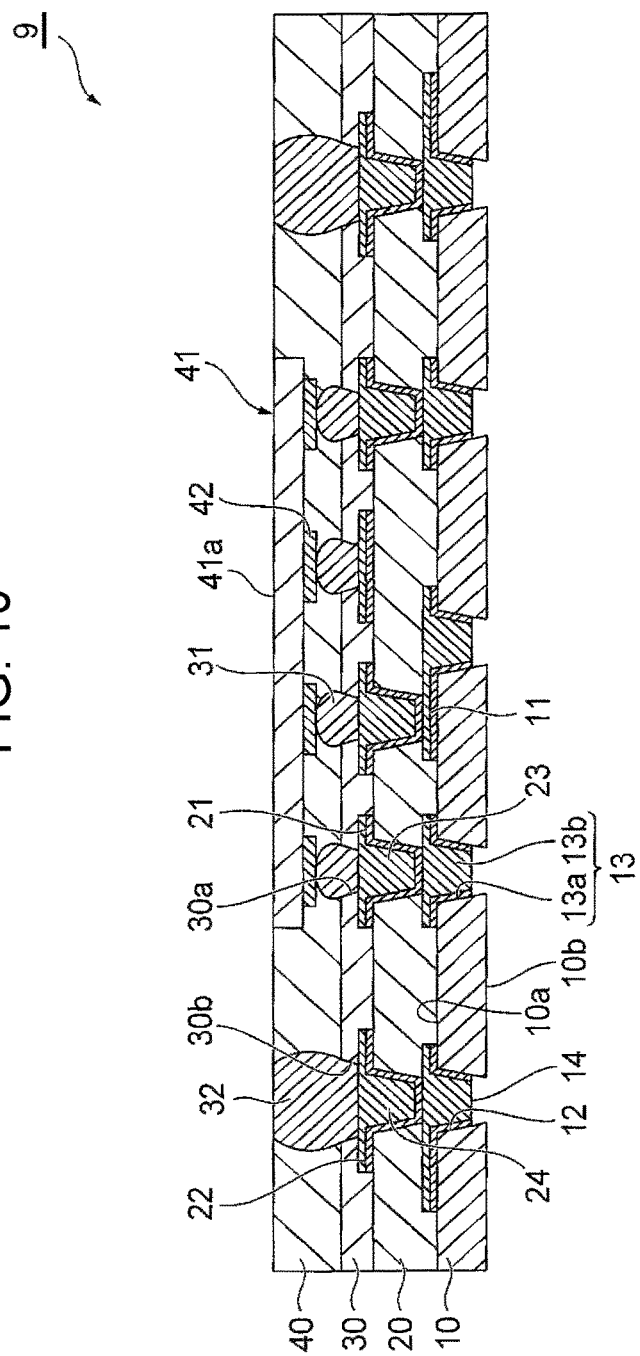
FIG. 10 is a cross-sectional view illustrating a printed wiring board for package-on-package according to a eighth embodiment.

In the following, with reference to FIG. 10, an eighth embodiment of the present invention is described. A printed wiring board 9 for package-on-package according to the present embodiment is different from the seventh embodiment in that an IC chip 41 is mounted on the printed wiring board 8 for package-on-package according to the seventh embodiment and is further sealed by a sealing resin layer 40. The other structures and the like are the same as the seventh embodiment.

Specifically, the IC chip 41 is positioned on the second insulating layer 20 side. The IC chip 41 is mounted on the first pads 21 via the solder bumps 31. Terminals 42 of the IC chip 41 are electrically connected to the first pads 21 by the solder bumps 31. The IC chip 41, the solder bumps 31 and the solder bumps 32 are further sealed by the sealing resin layer 40. The sealing resin layer 40 is laminated on the solder resist layer 30 on the second insulating layer 20 side. Although the solder bumps 32 are sealed by the sealing resin layer 40, at least a portion of a front end of each of the solder bumps 32 is exposed to the outside from the sealing resin layer 40. Further, a surface (41a) of the IC chip 41 is exposed to the outside from the sealing resin layer 40.

In the printed wiring board 9 for package-on-package according to the present embodiment, in addition to the same operation effect as the seventh embodiment, the following operation effect can be further obtained. That is, since at least a portion of the front end of each of the solder bumps 32 is exposed to the outside from the sealing resin layer 40, another printed wiring board can be positioned above the IC chip 41 and can be mounted on the second pads 22 via the solder bumps 32. As a result, a space above the IC chip 41 can be effectively utilized, and reduction in thickness of an entire POP structure in which the printed wiring board 9 for package-on-package is used can be easily achieved.

Further, since the surface (41a) of the IC chip 41 is exposed to the outside from the sealing resin layer 40, heat generated during operation of the IC chip 41 can be quickly released to the outside via the surface (41a), and an effect is achieved that heat dissipation performance of the printed wiring board 9 for package-on-package is enhanced. Further, since there is no sealing resin layer 40 covering the surface (41a) of the IC chip 41 from above, reduction in thickness of the printed wiring board 9 for package-on-package can be even more easily achieved.

Ninth Embodiment

Figure 11:
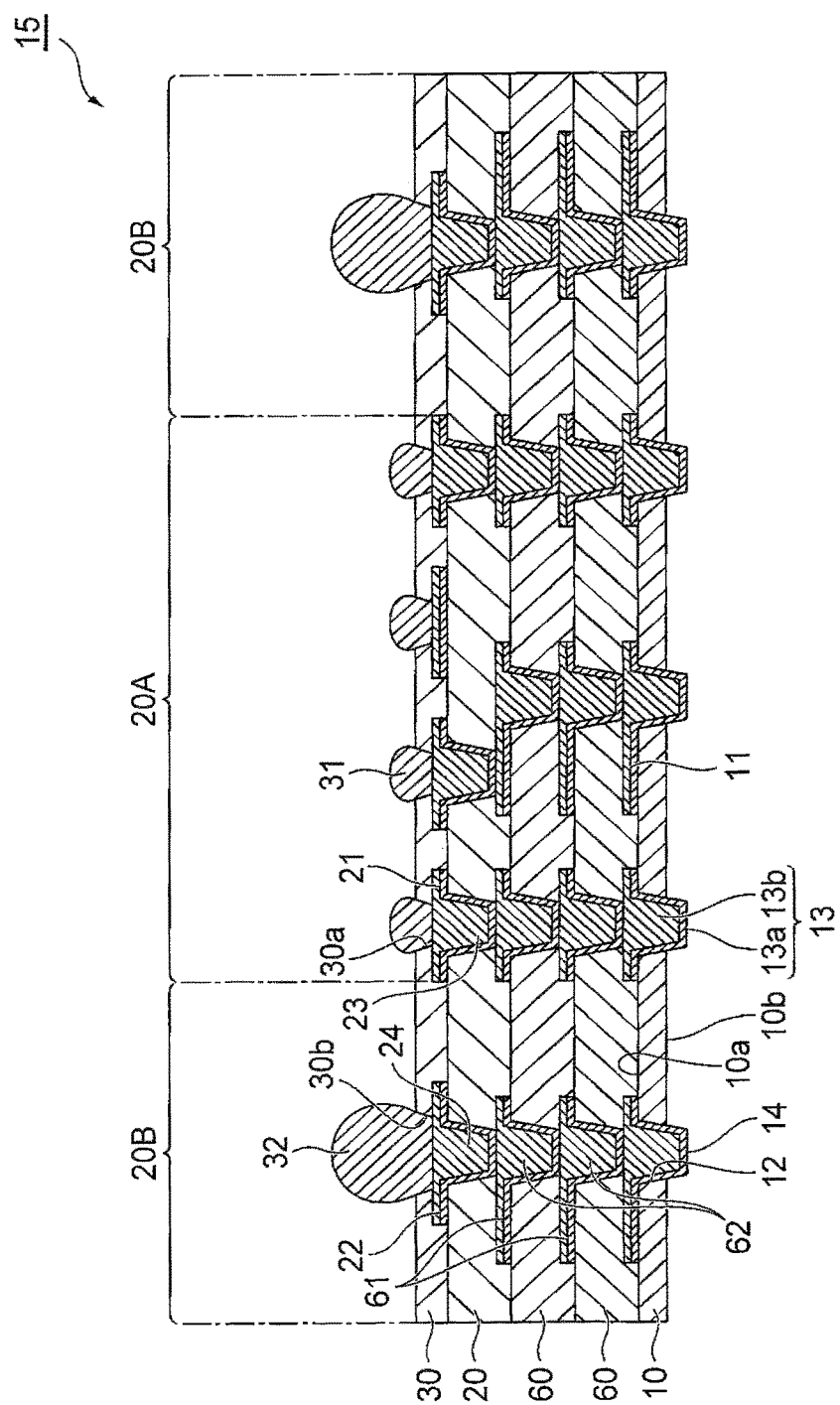
FIG. 11 is a cross-sectional view illustrating a printed wiring board for package-on-package according to a ninth embodiment.

In the following, with reference to FIG. 11, a ninth embodiment of the present invention is described. A printed wiring board 15 for package-on-package according to the present embodiment is different from the first embodiment in that multiple third insulating layers 60 are further laminated between the a first insulating layer 10 and the second insulating layer 20. The other structures and the like are the same as the first embodiment.

Specifically, two third insulating layers 60 and two conductor patterns 61 are alternately laminated between the first insulating layer 10 and the second insulating layer 20. Similar to the first insulating layer 10 and the second insulating layer 20, the third insulating layers 60 are each formed of a thermosetting resin, a photosensitive resin, a resin that is obtained by adding a photosensitive group to a portion of a thermosetting resin, a thermoplastic resin, a resin composite that contains these resins, or the like. Similar to the conductor pattern 11, the conductor patterns 61 are each formed from an electroless plating layer and an electrolytic plating layer.

Further, via conductors 62 are formed inside each of the third insulating layers 60. The via conductors 62 electrically connect between the conductor patterns 61, or between the conductor pattern 61 and the conductor pattern 11, which are adjacent to each other in a lamination direction. Among the first insulating layer 10, the second insulating layer 20 and the third insulating layers 60, the first insulating layer 10 is formed on a lowermost side, and the second insulating layer 20 is formed on an uppermost side. In the present embodiment, the two third insulating layers 60 and the two conductor patterns 61 are laminated between the first insulating layer 10 and the second insulating layer 20. However, when desired, the number of the third insulating layers 60 and the number of the conductor patterns 61 can be increased or decreased.

Tenth Embodiment

Figure 12:
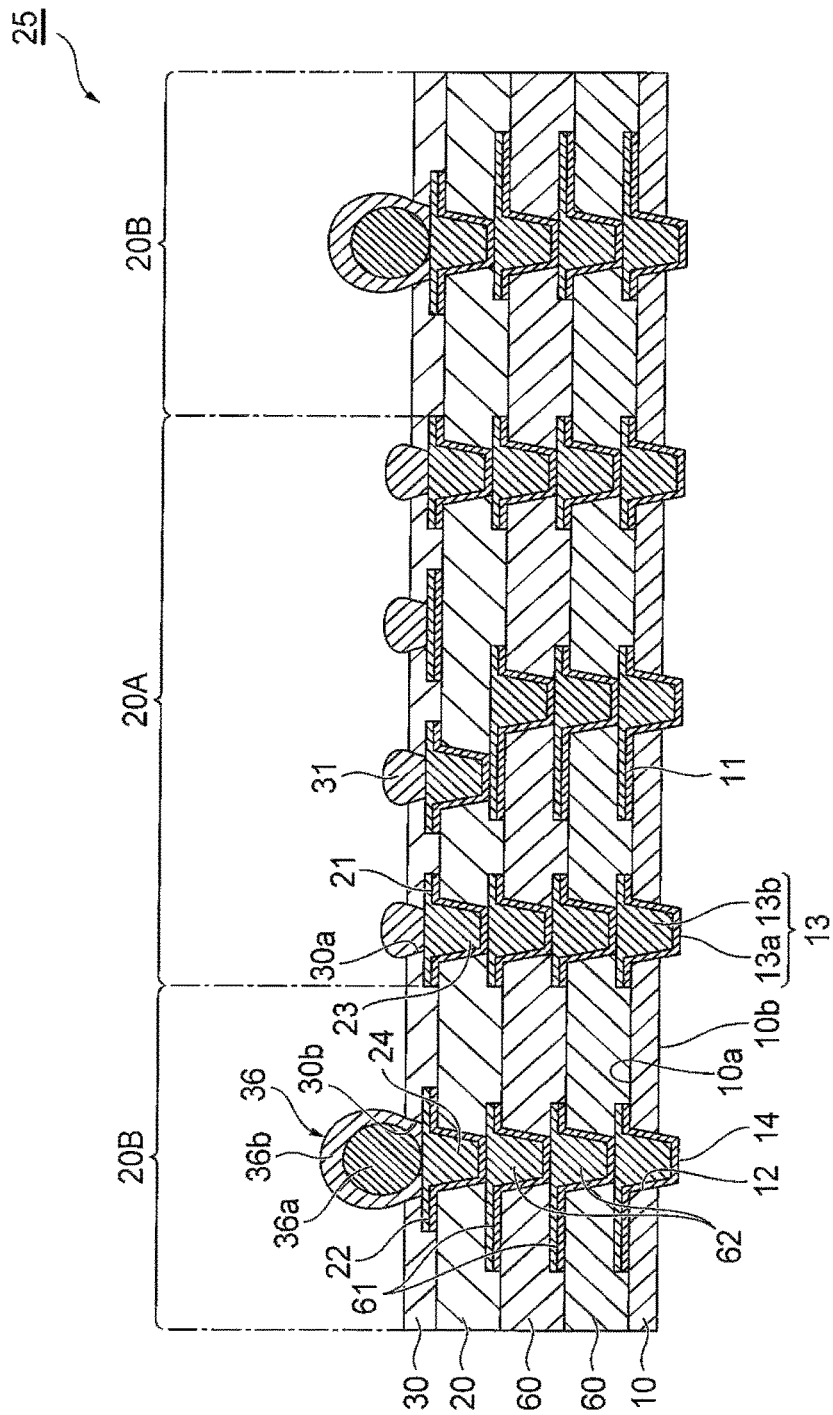
FIG. 12 is a cross-sectional view illustrating a printed wiring board for package-on-package according to a tenth embodiment.

In the following, with reference to FIG. 12, a tenth embodiment of the present invention is described. A printed wiring board 25 for package-on-package according to the present embodiment is different from the ninth embodiment in that, in place of the solder bumps 32, metal core balls 36 are provided. As illustrated in FIG. 12, the metal core balls 36 are respectively formed on the second pads 22. The metal core balls 36 are each formed to have a metallic core part (36a) and a solder part (36b) that is provided around the core part (36a) and has a lower hardness and a lower melting point than the core part (36a).

The core part (36a) is formed of, for example, copper, nickel, aluminum, tungsten, gold, silver, or an alloy that contains at least one of these metals as a main component. In the present embodiment, the core part (36a) formed of copper is used. Further, in addition to a shape of a ball illustrated in FIG. 12, the core part (36a) may also have a shape of an oval, a circular cylinder, a cube, a polygonal column, or the like. On the other hand, the solder part (36b) may be formed of a material that contains at least one of tin, indium, zinc and lead as a main component. The metal core balls 36 correspond to the "first connection terminals" in the claims, and are structures for electrically connecting the second pads 22 and terminals or the like of another printed wiring board when the another printed wiring board is mounted.

Eleventh Embodiment

Figure 13:
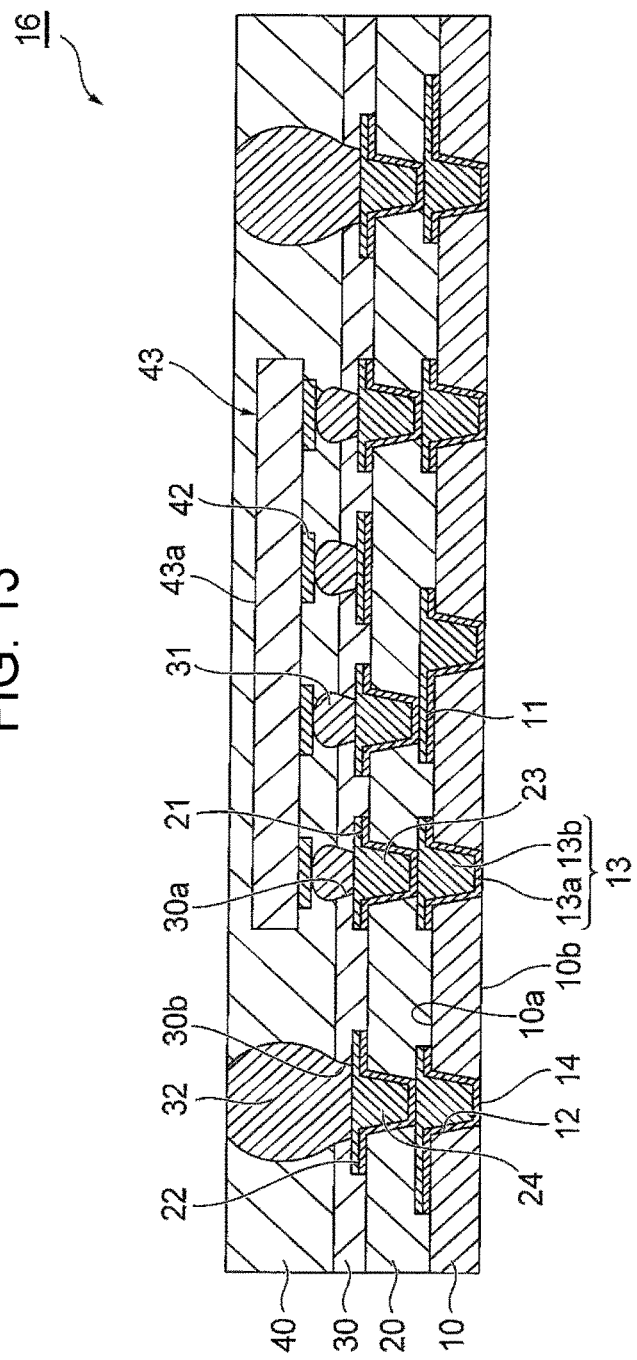
FIG. 13 is a cross-sectional view illustrating a printed wiring board for package-on-package according to a eleventh embodiment.

In the following, with reference to FIG. 13, an eleventh embodiment of the present invention is described. A printed wiring board 16 for package-on-package according to the present embodiment is different from the third embodiment in that, in addition to that the surface 14 of each of the electrodes 13 is positioned on the same plane as the second surface (10b) of the first insulating layer 10, a surface (43a) of an IC chip 43 is not exposed to the outside from the sealing resin layer 40. That is, an upper side of the IC chip 43 is covered by the sealing resin layer 40. On the other hand, by polishing, a portion of the front end of each of the solder bumps 32 is exposed to the outside from the sealing resin layer 40.

Twelfth Embodiment

Figure 14:
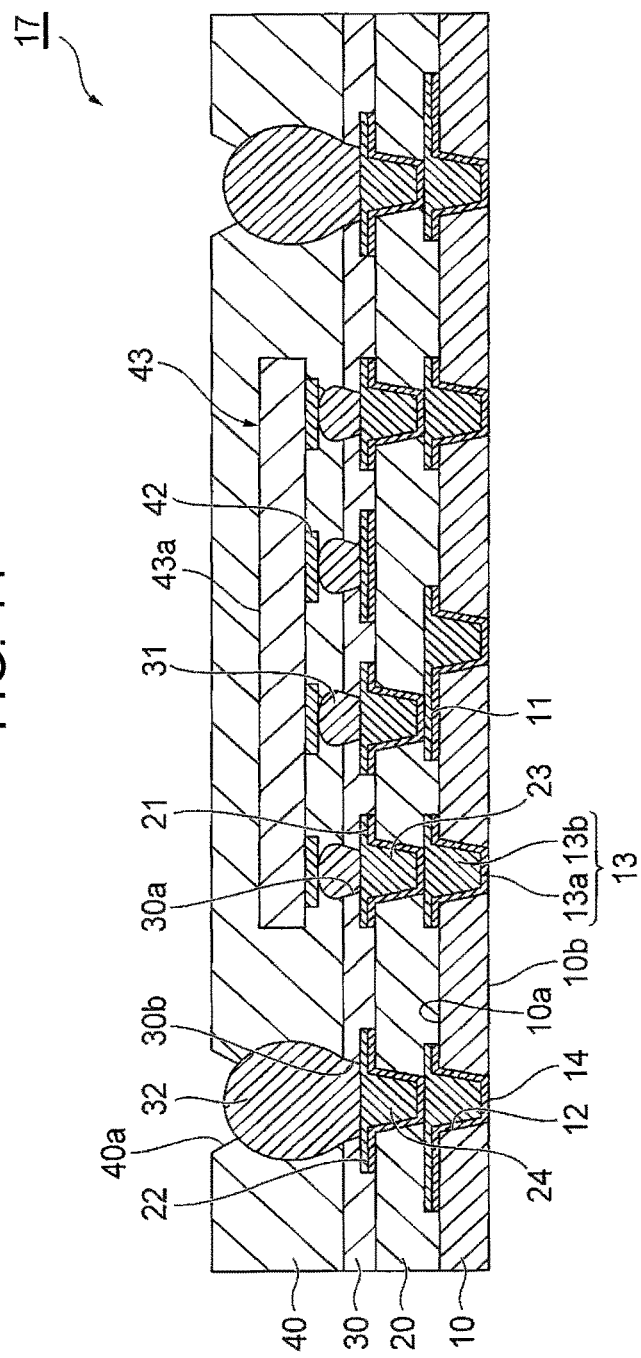
FIG. 14 is a cross-sectional view illustrating a printed wiring board for package-on-package according to a twelfth embodiment.

In the following, with reference to FIG. 14, a twelfth embodiment of the present invention is described. A printed wiring board 17 for package-on-package according to the present embodiment is different from the third embodiment in that, in addition to that the surface 14 of each of the electrodes 13 is positioned on the same plane as the second surface (10b) of the first insulating layer 10, the surface (43a) of the IC chip 43 is not exposed to the outside from the sealing resin layer 40 and further a portion of the front end of each of the solder bumps 32 is exposed to the outside from the sealing resin layer 40 by laser processing. In this case, for example, after the IC chip 43, the solder bumps 31 and the solder bumps 32 are sealed by the sealing resin layer 40, an opening part (40a) is formed by laser processing in the sealing resin layer 40 at a position above each of the solder bumps 32, and a portion of the front end of each of the solder bumps 32 is exposed to the outside.

Thirteenth Embodiment

Figure 15:
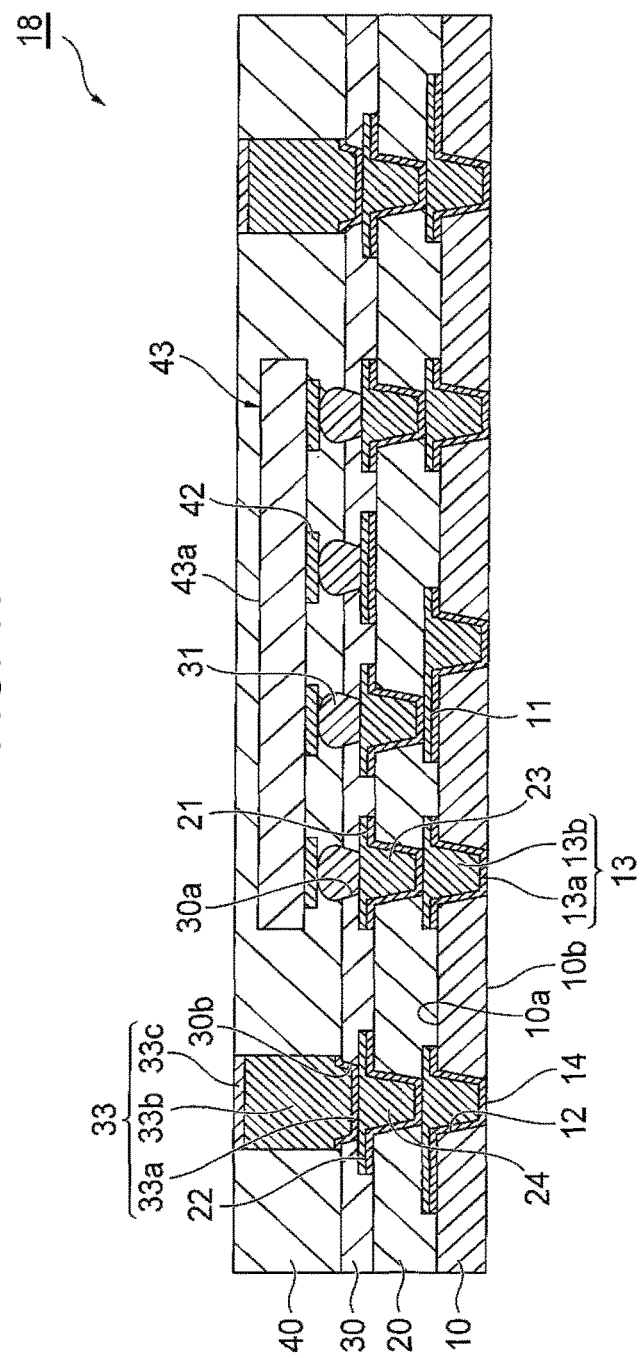
FIG. 15 is a cross-sectional view illustrating a printed wiring board for package-on-package according to a thirteenth embodiment.

In the following, with reference to FIG. 15, a thirteenth embodiment of the present invention is described. A printed wiring board 18 for package-on-package according to the present embodiment is different from the sixth embodiment in that the surface (43*a*) of the IC chip 43 is not exposed to the outside from the sealing resin layer 40. That is, an upper side of the IC chip 43 is covered by the sealing resin layer 40. On the other hand, by polishing, a portion of the front end of each of the conductor posts 33 (that is, a portion of the solder plating layer (33*c*)) is exposed to the outside from the sealing resin layer 40.

Fourteenth Embodiment

Figure 16:
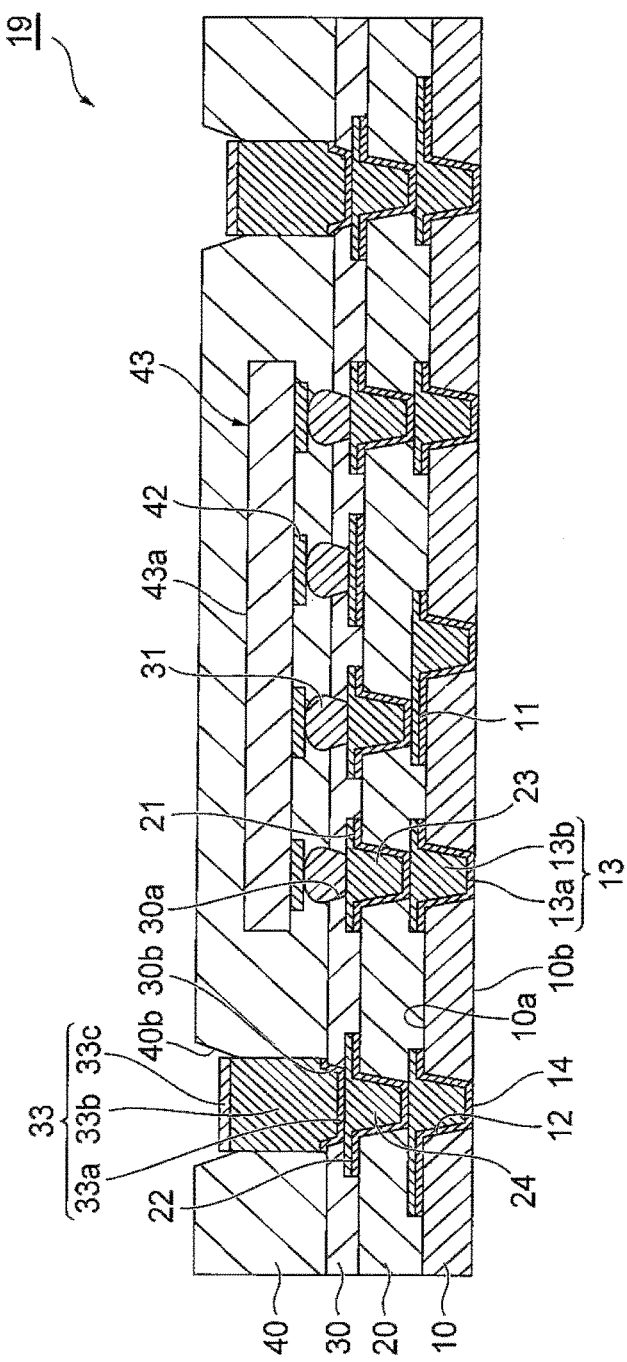
FIG. 16 is a cross-sectional view illustrating a printed wiring board for package-on-package according to a fourteenth embodiment.

In the following, with reference to FIG. 16, a fourteenth embodiment of the present invention is described. A printed wiring board 19 for package-on-package according to the present embodiment is different from the sixth embodiment in that the surface (43*a*) of the IC chip 43 is not exposed to the outside from the sealing resin layer 40 and further a portion of the front end of each of the conductor posts 33 is exposed to the outside from the sealing resin layer 40 by laser processing. In this case, for example, after the IC chip 43, the solder bumps 31 and the conductor posts 33 are sealed by the sealing resin layer 40, an opening part (40*b*) is formed by laser processing in the sealing resin layer 40 at a position above each of the conductor posts 33, and not only the front end but also a portion of a side surface of each of the conductor posts 33 (that is, the entire solder plating layer (33*c*) and a portion of the electrolytic plating layer (33*b*)) are exposed to the outside.

In the above, embodiments of the present invention are described in detail. However, the present invention is not limited to the above-described embodiments. Various design modifications can be performed within the scope without departing from the spirit of the present invention as described in appended claims. For example, the number of the first pads 21 and the number of the second pads 22 are not limited to those described above. Further, in the above-described embodiments, the description is not provided for all combinations. However, an embodiment of the present invention allows various combinations of the types of the electrodes, the types of the first connection terminals, the methods for exposing a portion of the front end of each of the first connection terminals and presence or absence of the support plate as described below. That is, with regard to the types of the electrodes, there are the type in which the surface of each of the electrodes that is exposed to the outside protrudes to the outside from the second surface of the first insulating layer, the type in which the surface of each of the electrodes that is exposed to the outside is positioned on the same plane as the second surface of the first insulating layer, and the type in which the surface of each of the electrodes that is exposed to the outside is recessed into the inside relative to the second surface of the first insulating layer. With regard to the types of the first connection terminals, there are the type of the solder bumps, the type of the conductor posts, and the type of the metal core balls. With regard to the methods for exposing a portion of the front end of each of the first connection terminals, the methods include polishing and laser processing. With regard to the support plate that is pasted on the second surface side of the first insulating layer, such a support plate may be present or absent. It is obvious that various combinations of these contents are possible.

In a printed wiring board for package-on-package, a structure may be adopted in which an upper substrate, an interposer and a lower substrate are stacked, and thus it is difficult to achieve reduction in thickness of the printed wiring board for package-on-package. Further, pads of the lower substrate for mounting a printed wiring board may be formed from a conductor pattern that is formed on the surface on the other side of the lower substrate, and may be connected to via conductors that is formed inside the lower substrate. Therefore, an interface is formed between the pad for mounting a printed wiring board and the via conductor. When fine peeling or a shape defect occurs at the interface, it is likely that it will affect mounting reliability.

A printed wiring board for package-on-package according to an embodiment of the present invention improves mounting reliability while reducing thickness.

A printed wiring board for package-on-package according to an embodiment of the present invention includes: a first insulating layer that has a first surface and a second surface that is on an opposite side of the first surface, and has a through hole; a conductor pattern that is formed on the first surface of the first insulating layer; an electrode that electrically connects to the conductor pattern, is formed in the through hole of the first insulating layer, and is exposed from the second surface of the first insulating layer; a second insulating layer that is laminated on the first surface side of the first insulating layer; first pads and second pads that are respectively formed on the second insulating layer, the first pads being positioned in a center portion of the second insulating layer for connecting to an IC chip, and the second pads being positioned in an outer edge portion of the second insulating layer for connecting to another printed wiring board, and via conductors that are formed inside the second insulating layer and respectively electrically connect to the first pads, the second pads and the conductor pattern.

According to an embodiment of the present invention, mounting reliability can be improved while reduction in thickness can be achieved.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board for package-on-package, comprising:
   a first insulating layer having a plurality of through holes;
   a wiring layer comprising a conductor pattern and formed on a first surface of the first insulating layer;
   a second insulating layer laminated on the first insulating layer such that the second insulating layer is formed on a first surface side of the first insulating layer;
   a plurality of electrodes formed in the plurality of through holes of the first insulating layer respectively such that the plurality of electrodes electrically connects to the conductor pattern and has a plurality of exposed surfaces exposed from a second surface of the first insulating layer on an opposite side with respect to the first surface;
   a plurality of first pads formed on the second insulating layer such that the plurality of first pads is positioned to connect an IC chip in a center portion of a surface of the second insulating layer, a plurality of second pads formed on the second insulating layer such that the plurality of second pads is positioned in an outer edge portion of the surface of the second insulating layer to connect a second printed wiring board; and a plurality of via conductors formed in the second insulating layer such that the plurality of via conductors electrically connects the plurality of first pads and the plurality of second pads to the conductor pattern of the wiring layer, wherein the plurality of electrodes is formed in the plurality of through holes in the first insulating layer respectively such that each of the electrodes has a respective one of the exposed surfaces and that the plurality of exposed surfaces and the second surface of the first insulating layer are formed on a same plane.

2. A printed wiring board for package-on-package according to claim 1, further comprising:
a plurality of first connection terminals formed on the plurality of second pads respectively such that the plurality of first connection terminals is exposed to the outside.

3. A printed wiring board for package-on-package according to claim 2, wherein the plurality of first connection terminals is one of a plurality of solder bumps, a plurality of conductor posts and a plurality of metal core balls.

4. A printed wiring board for package-on-package according to claim 2, further comprising:
a plurality of second connection terminals formed on the plurality of first pads, respectively;
the IC chip mounted to the plurality of first pads through the plurality of second connection terminals such that the IC chip is positioned on the surface of the second insulating layer; and
a sealing resin layer formed on the surface of the second insulating layer such that the IC chip, the first connection terminals and the second connection terminals are sealed in the sealing resin layer and that each of the first connection terminals has an end portion including an exposed portion which is exposed from the sealing resin layer.

5. A printed wiring board for package-on-package according to claim 1, further comprising:
a third insulating layer interposed between the first insulating layer and the second insulating layer,
wherein the first insulating layer is forming an outermost insulating layer.

6. A printed wiring board for package-on-package according to claim 1, further comprising:
a support plate attached to the second surface of the first insulating layer.

7. A printed wiring board for package-on-package according to claim 6, wherein the support plate comprises glass.

8. A printed wiring board for package-on-package according to claim 1, wherein the plurality of first pads and the plurality of second pads are formed such that each of the second pads has a plane surface area which is greater than a plane surface area of each of the first pads.

9. A printed wiring board for package-on-package according to claim 1, wherein the plurality of first pads and the plurality of second pads are formed such that the plurality of second pads has a positioning pitch which is greater than a positioning pitch of the plurality of first pads.

10. A printed wiring board for package-on-package according to claim 2, further comprising:
a third insulating layer interposed between the first insulating layer and the second insulating layer,
wherein the first insulating layer is forming an outermost insulating layer.

11. A printed wiring board for package-on-package according to claim 4, further comprising:
a third insulating layer interposed between the first insulating layer and the second insulating layer,
wherein the first insulating layer is forming an outermost insulating layer.

12. A printed wiring board for package-on-package according to claim 1, wherein the first insulating layer is forming an outermost insulating layer.

13. A printed wiring board for package-on-package according to claim 12, further comprising:
a plurality of first connection terminals formed on the plurality of second pads respectively such that the plurality of first connection terminals is exposed to the outside.

14. A printed wiring board for package-on-package according to claim 13, wherein the plurality of first connection terminals is one of a plurality of solder bumps, a plurality of conductor posts and a plurality of metal core balls.

15. A printed wiring board for package-on-package according to claim 13, further comprising:
a plurality of second connection terminals formed on the plurality of first pads, respectively;
the IC chip mounted to the plurality of first pads through the plurality of second connection terminals such that the IC chip is positioned on the surface of the second insulating layer; and
a sealing resin layer formed on the surface of the second insulating layer such that the IC chip, the first connection terminals and the second connection terminals are sealed in the sealing resin layer and that each of the first connection terminals has an end portion including an exposed portion which is exposed from the sealing resin layer.

16. A printed wiring board for package-on-package according to claim 12, wherein the plurality of first pads and the plurality of second pads are formed such that each of the second pads has a plane surface area which is greater than a plane surface area of each of the first pads.

17. A printed wiring board for package-on-package according to claim 12, wherein the plurality of first pads and the plurality of second pads are formed such that the plurality of second pads has a positioning pitch which is greater than a positioning pitch of the plurality of first pads.

18. A printed wiring board for package-on-package according to claim 2, wherein the plurality of first pads and the plurality of second pads are formed such that each of the second pads has a plane surface area which is greater than a plane surface area of each of the first pads.

19. A printed wiring board for package-on-package according to claim 2, wherein the plurality of first pads and the plurality of second pads are formed such that the plurality of second pads has a positioning pitch which is greater than a positioning pitch of the plurality of first pads.

20. A printed wiring board for package-on-package according to claim 3, further comprising:
a plurality of second connection terminals formed on the plurality of first pads, respectively:
the IC chip mounted to the plurality of first pads through the plurality of second connection terminals such that the IC chip is positioned on the surface of the second insulating layer; and
a sealing resin layer formed on the surface of the second insulating layer such that the IC chip, the first connection terminals and the second connection terminals are sealed in the sealing resin layer and that each of the first connection terminals has an end portion including an exposed portion which is exposed from the sealing resin layer.

* * * * *